(12) United States Patent
Maeda (10) Patent No.: US 7,977,988 B2
(45) Date of Patent: Jul. 12, 2011

(54) DELAY ADJUSTING METHOD, AND DELAY CIRCUIT

(75) Inventor: Masazumi Maeda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 12/542,861

(22) Filed: Aug. 18, 2009

(65) Prior Publication Data
US 2009/0302910 A1 Dec. 10, 2009

Related U.S. Application Data

(63) Continuation of application No. PCT/JP2007/057220, filed on Mar. 30, 2007.

(51) Int. Cl.
*H03L 7/00* (2006.01)
(52) U.S. Cl. .......................... 327/161; 327/147; 327/277
(58) Field of Classification Search .................. 327/147, 327/161, 277
See application file for complete search history.

(56) References Cited

U.S. PATENT DOCUMENTS

| | | | |
|---|---|---|---|
| 5,451,894 A * | 9/1995 | Guo | ............................... 327/241 |
| 5,995,441 A | 11/1999 | Kato et al. | |
| 6,178,123 B1 | 1/2001 | Kato et al. | |
| 6,281,725 B1 | 8/2001 | Hanzawa et al. | |
| 6,570,419 B2 | 5/2003 | Hanzawa et al. | |
| 6,756,833 B2 | 6/2004 | Miura | |

FOREIGN PATENT DOCUMENTS

| | | |
|---|---|---|
| JP | 09-0321590 A | 12/1997 |
| JP | 11-306757 A | 11/1999 |
| JP | 2000-59209 A | 2/2000 |
| JP | 2003-023343 A | 1/2003 |

OTHER PUBLICATIONS

International Search Report of PCT/JP2007/057220, Mailing Date of May 15, 2007.

* cited by examiner

*Primary Examiner* — Lincoln Donovan
*Assistant Examiner* — John W Poos
(74) *Attorney, Agent, or Firm* — Westerman, Hattori, Daniels & Adrian, LLP (57) ABSTRACT

A variable delay circuit 1 includes: a multistage delay circuit 20 constructed by connecting delay elements D1 to Dn in series; a selecting unit 21 which selects one delayed signal obtained by introducing different amounts of delay by passing a reference clock through one or more of the delay elements D1 to Dn; a decision unit 23 which, at decision timing synchronized to the reference clock, makes a decision on the logic state of each delayed signal sequentially selected from among the plurality of delayed signals; and a changing point detection unit 24 which detects at least two delay elements Dm and Dk where a change has occurred in the logic state of the reference clock at the decision timing, and wherein the difference (k−m) between the numbers of delay elements through which the clock signal has passed until reaching one of the two detected delay elements Dm and Dk is used as the number of delay elements that provides a desired delay time.

8 Claims, 12 Drawing Sheets

DELAY ADJUSTING METHOD, AND DELAY CIRCUIT

CROSS REFERENCE TO RELATED APPLICATION

The present application is a continuation application based on International application No. PCT/JP2007/057220, filed on Mar. 30, 2007.

TECHNICAL FIELD

The present invention relates to a delay circuit mounted in a semiconductor integrated circuit, and a delay time adjusting method for adjusting the delay time of such a delay circuit.

BACKGROUND ART

To increase the timing margin allowed for data to be transferred in a synchronous transfer mode in a semiconductor integrated circuit, techniques have been established that provide a delay time to a given signal. With recent advances in data transfer speed, there has developed a need for a delayed signal generating circuit that can adjust the delay time in finer steps and with higher accuracy.

Figure 1:
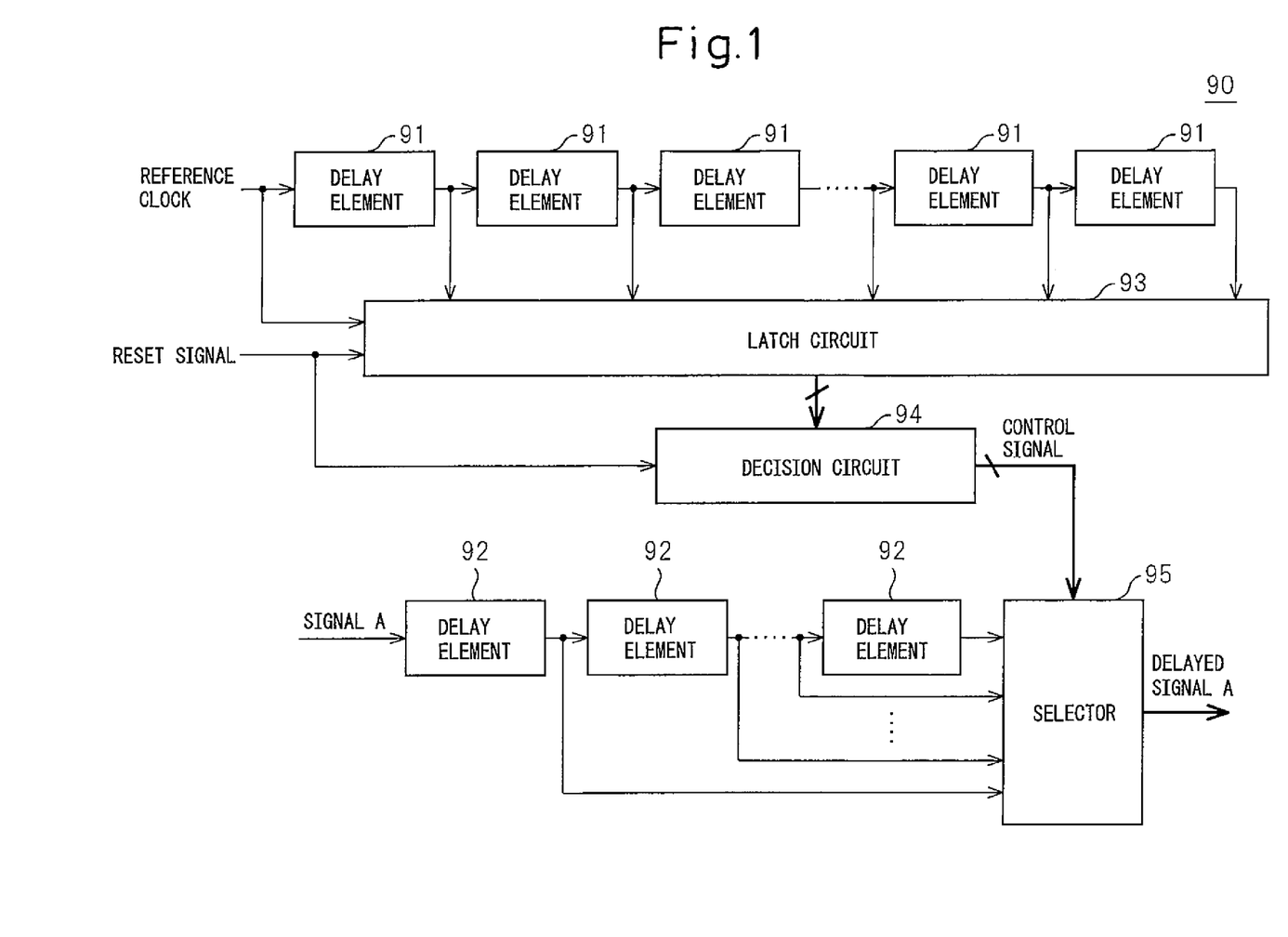
FIG. 1 is a circuit configuration diagram of a prior art delayed signal generating circuit.
Figure 2:
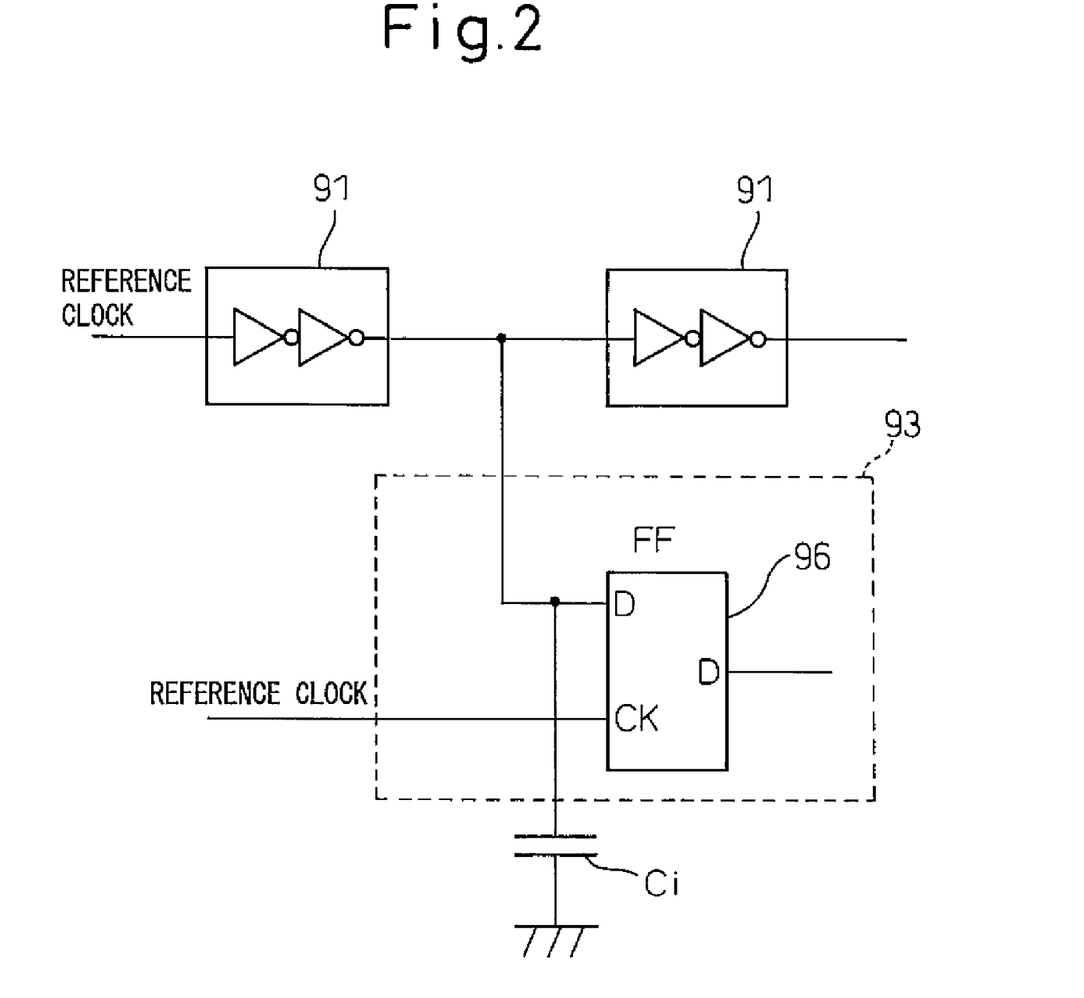
FIG. 2 is a diagram depicting an input capacitance on a latch circuit in the delayed signal generating circuit of FIG. 1.

FIG. 1 is a circuit configuration diagram of a prior art delayed signal generating circuit disclosed in patent document 1 cited below. The delayed signal generating circuit 90 includes N delay elements 91 for delaying a reference clock, S delay elements 92 for delaying a signal A, i.e., the target signal to be delayed, a latch circuit 93 which latches the signal stored in each delay element 91 at the falling edge of the reference clock, a decision circuit 94 which detects from the signal latched in the latch circuit 93 the number of delay elements 91 whose signals are "Hi", and a selector 95 which selects, in accordance with a control signal from the decision circuit 94, the delay element 92 from which a delayed version of the signal A is to be extracted, wherein the number of delay elements through which the target signal is to be delayed is adjusted in accordance with the ratio of the pulse duration of the reference clock to the delay time of each delay element, thereby avoiding the effects that temperature variations or voltage variations may have on the amount of delay.

Patent document 2 cited below discloses a synchronous type semiconductor storage device equipped with an initial delay control value determining circuit that determines the initial value of the delay control value by detecting how far a pulse signal corresponding to one clock cycle of an external clock signal propagates through a variable delay circuit within a predetermined time.

Further, patent document 3 cited below discloses a clock regenerating circuit having a control circuit that detects the number of delay stages in a delay circuit necessary for synchronization by comparing the phase of an external clock with the phases of a plurality of reference clocks.

Patent document 1: Japanese Unexamined Patent Publication No. 2003-23343
Patent document 2: Japanese Unexamined Patent Publication No. H11-306757
Patent document 3: Japanese Unexamined Patent Publication No. 2000-59209

DISCLOSURE OF THE INVENTION

In a delay time measuring method according to a first mode of the present invention, a reference clock is input into a multistage delay circuit constructed by connecting a plurality of delay elements in series, at decision timing synchronized to the reference clock a decision is made on the logic state of each delayed signal sequentially selected from among a plurality of delayed signals obtained by introducing different amounts of delay by passing the reference clock through one or more of the delay elements, at least two delay elements where a change has occurred in the logic state of the reference clock at the decision timing is detected, and the difference between the numbers of delay elements through which the clock signal has passes until reaching respective ones of the two detected delay elements is determined as the number of delay elements that provides a desired delay time.

In a delay time adjusting method according to a second mode of the present invention, the multistage delay circuit used in the delay time measuring method of the first mode is configured as a first multistage delay circuit, the input signal is input into a second multistage delay circuit constructed from a plurality of delay elements connected in series, the number of delay elements determined by the delay time measuring method of the first mode is multiplied by a predetermined delay time set value to determine the number of delay elements through which the input signal is to be passed, and the input signal that has been delayed through the thus determined number of delay elements is extracted from the second multistage delay circuit.

A variable delay circuit according to a third mode of the present invention includes: a multistage delay circuit constructed by connecting a plurality of delay elements in series; a selecting unit which selects any of a plurality of delayed signals obtained by introducing different amounts of delay by passing a reference clock through one or more of the delay elements; a decision unit which, at decision timing synchronized to the reference clock, makes a decision on the logic state of each delayed signal sequentially selected by the selecting unit from among the plurality of delayed signals; and a changing point detection unit which detects at least two delay elements where a change has occurred in the logic state of the reference clock at the decision timing, and wherein the difference between the numbers of delay elements through which the clock signal has passes until reaching respective ones of the two detected delay elements is used as the number of delay elements that provides a desired delay time.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF THE REFERENCE NUMERALS

1 . . . VARIABLE DELAY CIRCUIT
2 . . . MEASURING CIRCUIT
3 . . . DELAY CIRCUIT
20, 30 . . . MULTISTAGE DELAY CIRCUIT
21, 31 . . . SELECTION CIRCUIT

BEST MODE FOR CARRYING OUT THE INVENTION

Figure 3:
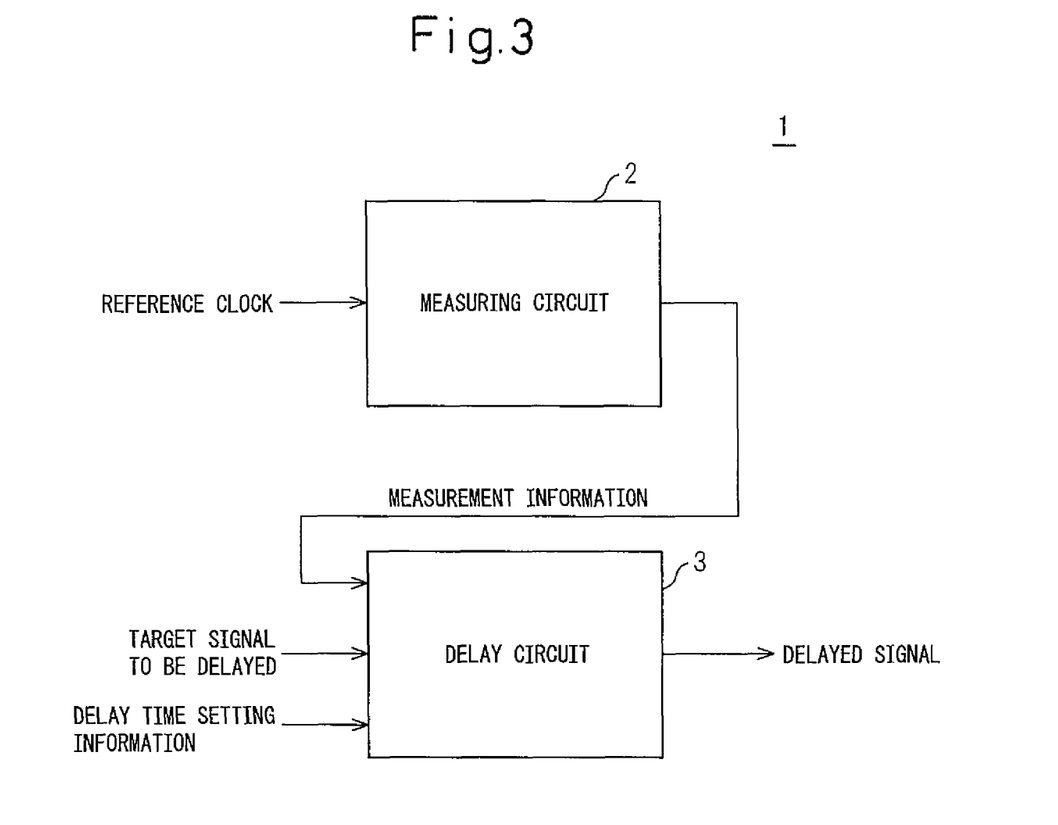
FIG. 3 is a circuit configuration diagram of a variable delay circuit according to an embodiment of the present invention.

An embodiment of the present invention will be described below with reference to the accompanying drawings. FIG. 3 is a circuit configuration diagram of a variable delay circuit according to the embodiment of the present invention. As illustrated, the variable delay circuit 1 includes a measuring circuit 2 and a delay circuit 3; here, the measuring circuit 2 takes a reference clock as an input and measures how many delay elements would provide a propagation delay time corresponding to one clock cycle of the reference clock.

Based on the information from the measuring circuit 2 that indicates the number of delay elements that provides the propagation delay time corresponding to one clock cycle of the reference clock, and on delay time setting information that defines the delay time to be provided to the target signal, the delay circuit 3 determines the number of delay elements to be used for delaying the target signal, and thus delays the target signal input to it.

Figure 4:
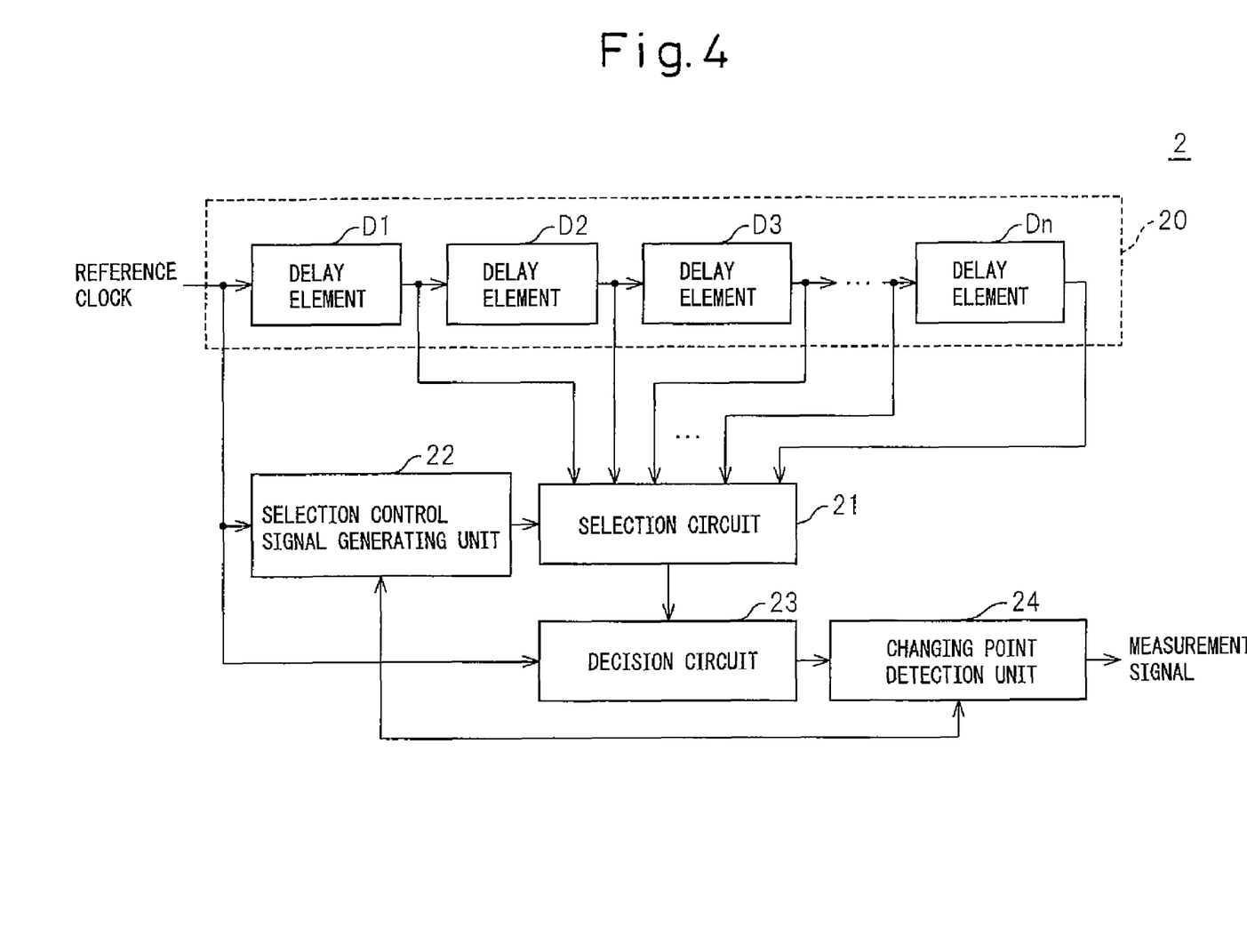
FIG. 4 is a schematic configuration diagram of a decision circuit depicted in FIG. 3.

FIG. 4 is a schematic configuration diagram of the measuring circuit 2 depicted in FIG. 3. The measuring circuit 2 includes a multistage delay circuit 20 which delays the reference clock through n series-connected delay elements D1 to Dn (n is a natural number), a selection circuit 21 which selects signals output from the respective delay elements D1 to Dn, a selection control signal generating unit 22 which generates a selection control signal for causing the selection circuit 21 to sequentially select the signals output from the respective delay elements D1 to Dn, and a decision circuit 23 which, at the rising edge of the reference clock, makes a decision on the logic state of the output signal of each delay element selected by the selection circuit 21.

As illustrated, the delay element into which the reference clock is first input in the multistage delay circuit 20 is designated as delay element D1, and an element number "1" is assigned to this delay element D1. The delay element connected immediately following a delay element Di having an element number "i" is designated as delay element Di+1 and assigned an element number "i+1".

The selection control signal generating unit 22 may be configured as a simple counter circuit that counts the number of pulses of the reference clock up to n. In that case, the counted number of pulses of the reference clock is output as the selection control signal which specifies the element number i of the delay element Di (i=1 to n) whose output signal is to be selected by the selection circuit 21.

The selection control signal is output to a changing point detection unit 24 to be described later, as well as to the selection circuit 21, and the count number is reset to "1" when the number has reached n or when a reset signal is applied from the changing point detection unit 24.

The measuring circuit 2 further includes a number-of-delay-elements determining unit 25 in addition to the changing point detection unit 24.

The selection circuit 21 sequentially selects the output signals of the delay elements Di, starting from the output signal of the delay element D1, by advancing the element number i by 1 at a time, and the decision circuit 23 makes a decision on the logic state of each selected output signal; then, the changing point detection unit 24 detects at least two element numbers i where the logic state of the output signal has changed from "Lo" to "Hi", and outputs the element numbers m and k where such a change has occurred.

Figure 5:
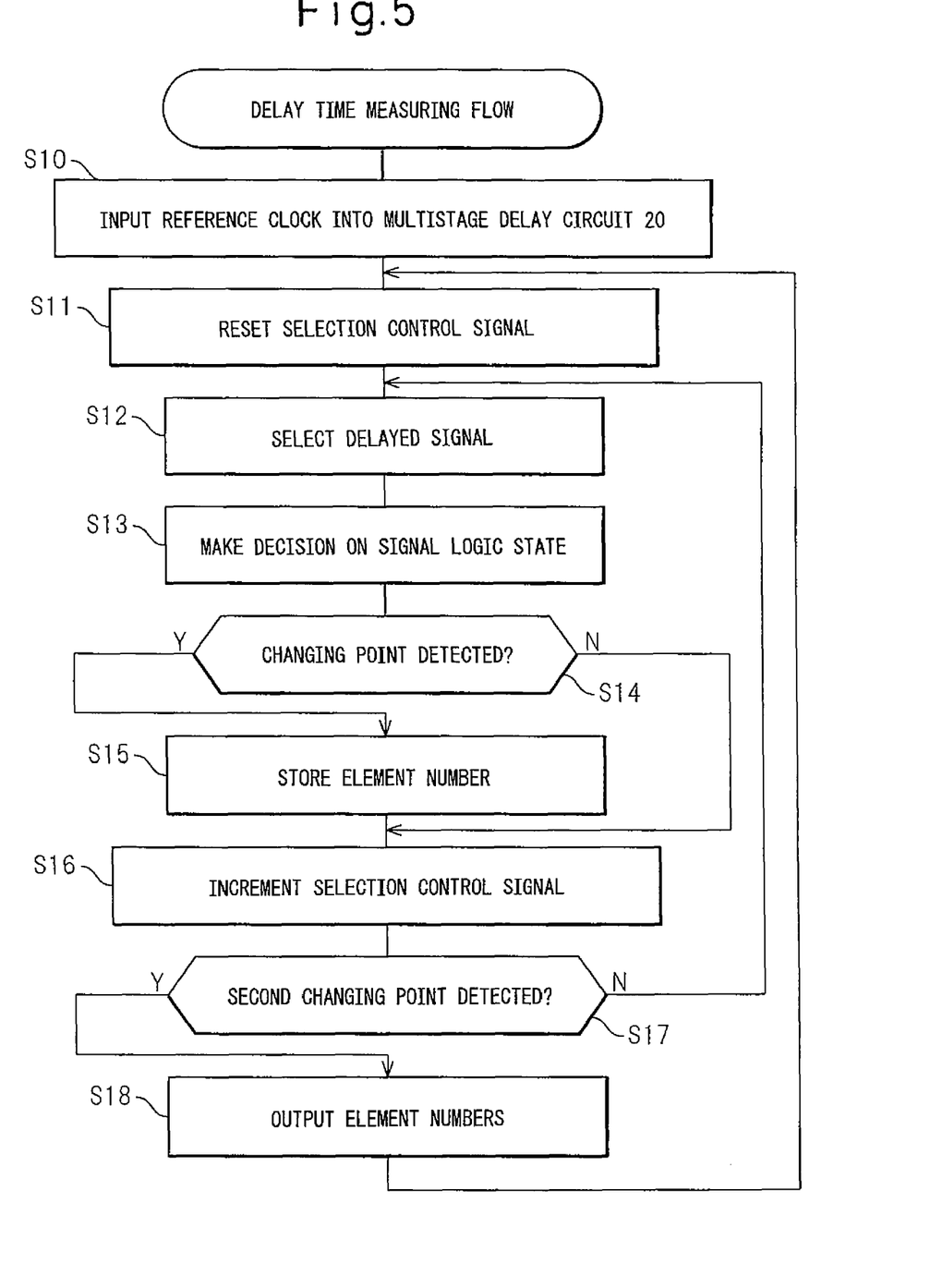
FIG. 5 is a flowchart of a delay time measuring method according to the embodiment of the present invention.

FIG. 5 is a flowchart of a delay time measuring method according to the embodiment of the present invention.

In step S10, the reference clock is input into the multistage delay circuit 20, and in step S11, the selection control signal is reset by setting the number counted by the selection control signal generating unit 22 back to "1".

In step S12, the selection control signal generated by the selection control signal generating unit 22 is applied to the selection circuit 21 to select the output signal of the delay element D1, and the selected signal is supplied to the decision circuit 23; then, in step S13, the decision circuit 23 makes a decision on the logic stage of the supplied signal at the rising edge of the reference clock. Steps S12 and S13 are repeated while incrementing the value of the selection control signal by 1 at a time in step S16, and this loop is repeatedly executed until it is interrupted by the decision step S17.

Figure 6:
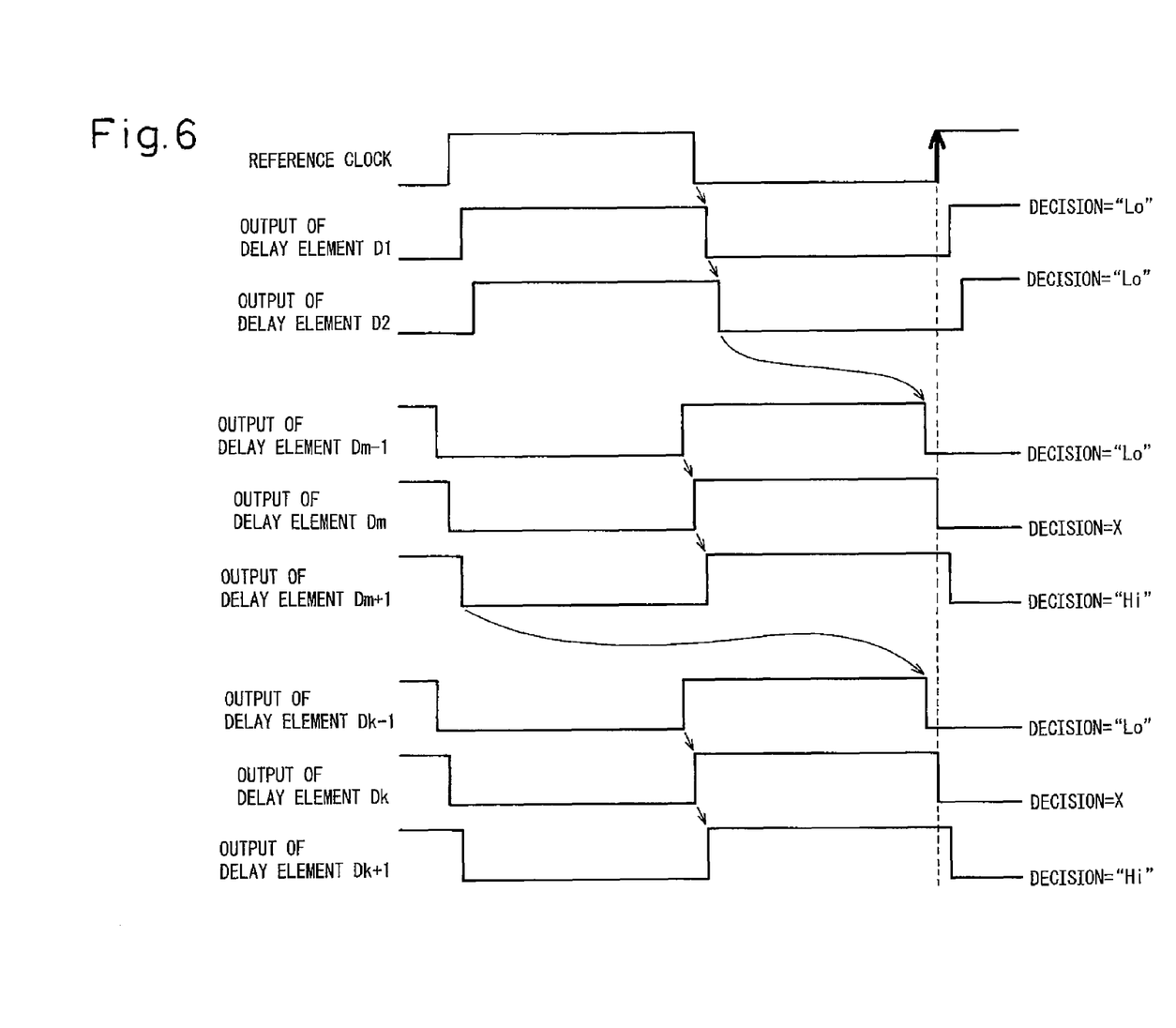
FIG. 6 is a time chart illustrating a reference clock and variously delayed signals.

FIG. 6 is a time chart illustrating the reference clock and variously delayed signals. As illustrated, a propagation delay equivalent to one delay element is introduced into the reference clock as it passes through each delay element.

In the illustrated example, the logic level of each of the output signals of the delay elements from D1 to Dm−1 is judged to be "Lo" by the decision circuit 23. Then, the logic state of the output signal of the delay element Dm or Dm+1 is judged to be "Hi", and it can thus be decided that a signal logic change has occurred at the delay element Dm. With this decision, it is found that the sum of the propagation delays introduced by the m delay elements corresponds to one half the clock cycle of the reference clock.

When this signal logic change is detected in step S14, the changing point detection unit 24 stores the element number "m" in step S15.

Thereafter, the selection control signal is sequentially incremented to search for the next point at which the signal logic state changes from "Lo" to "Hi". In the example of FIG. 6, the signal logic state changes at the delay element Dk (or Dk+1). With this decision, it is found that the sum of the propagation delays introduced by the k delay elements corresponds to one and a half clock cycles of the reference clock. In steps S14 and S15, the changing point detection unit 24 stores the element number "k".

When the signal logic change is detected that has occurred on the output signal of the delay element Dk, the changing point detection unit 24 follows the YES branch of the decision step S17 to proceed to step S18. In step S18, the changing point detection unit 24 outputs the two detected element numbers "m" and "k" as measurement information to the delay circuit 3, and the process returns to step S11. Thereupon, the selection control signal is reset, and the delay time measuring process is repeated.

Figure 7:
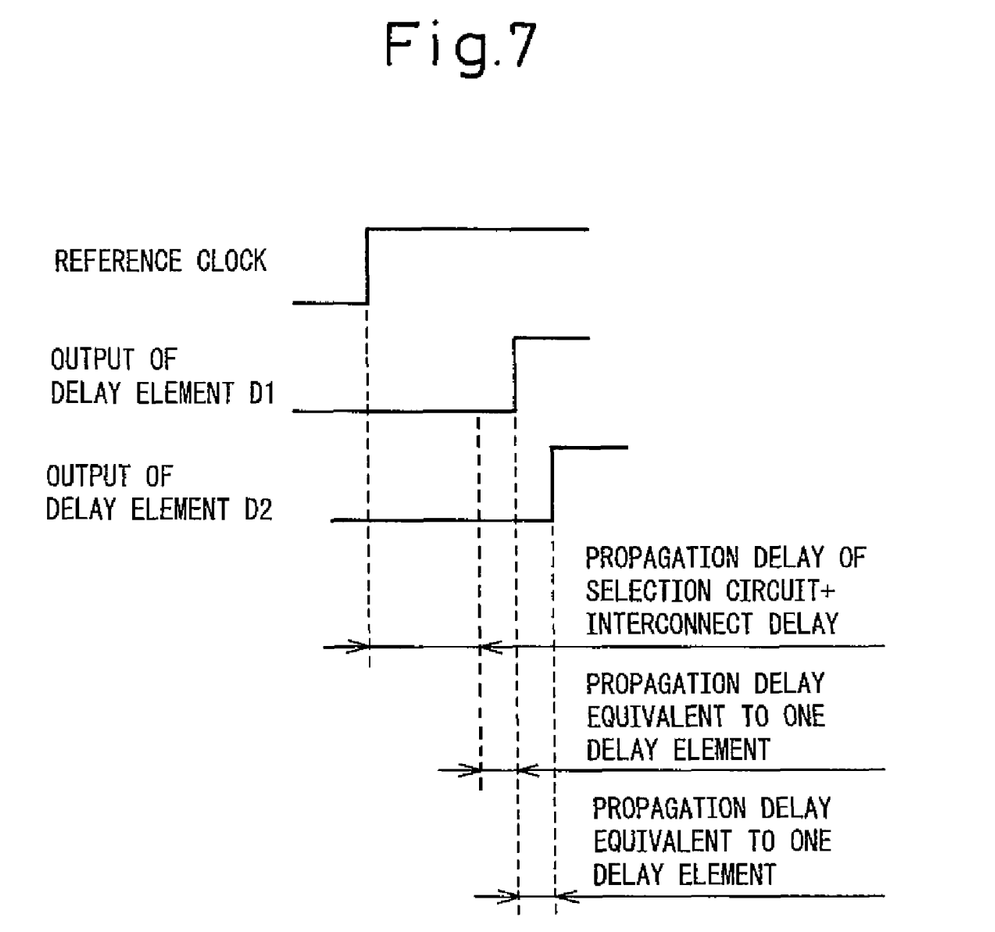
FIG. 7 is an explanatory diagram of the propagation delay and interconnect delay associated with delay elements and a selection circuit.

FIG. 7 is an explanatory diagram of the propagation delay and interconnect delay associated with the delay elements D1 to Dn and the selection circuit 21. As can be seen from FIG. 4, because of the provision of the selection circuit 21 in the measuring circuit 2, not only the propagation delay associated with the delay elements D1 to Dn but the fixed absolute delay time, such as the interconnect delay and propagation delay associated with the selection circuit 21, is also introduced into the signal that is supplied to the decision circuit 23. Therefore, more precisely, the time corresponding to one half the clock cycle of the reference clock is the sum of the delay time equivalent to the m delay elements and the absolute delay time, and the time corresponding to one and a half clock cycles of the reference clock is the sum of the delay time equivalent to the k delay elements and the absolute delay time.

Here, the time corresponding to one clock cycle of the reference clock is given by the following equation (1).

$$\text{One clock cycle of reference clock} = \text{Delay time equivalent to } k \text{ delay elements} - \text{Delay time equivalent to } m \text{ delay elements} \quad (1)$$

Therefore, when adjusting the delay in the delay circuit 3 at the subsequent stage, if (k−m) is specified as the number of delay elements that provides the delay time corresponding to one clock cycle of the reference clock, the error caused by the fixed absolute delay time, such as the interconnect delay and propagation delay associated with the selection circuit 21, can be eliminated.

Figure 8:
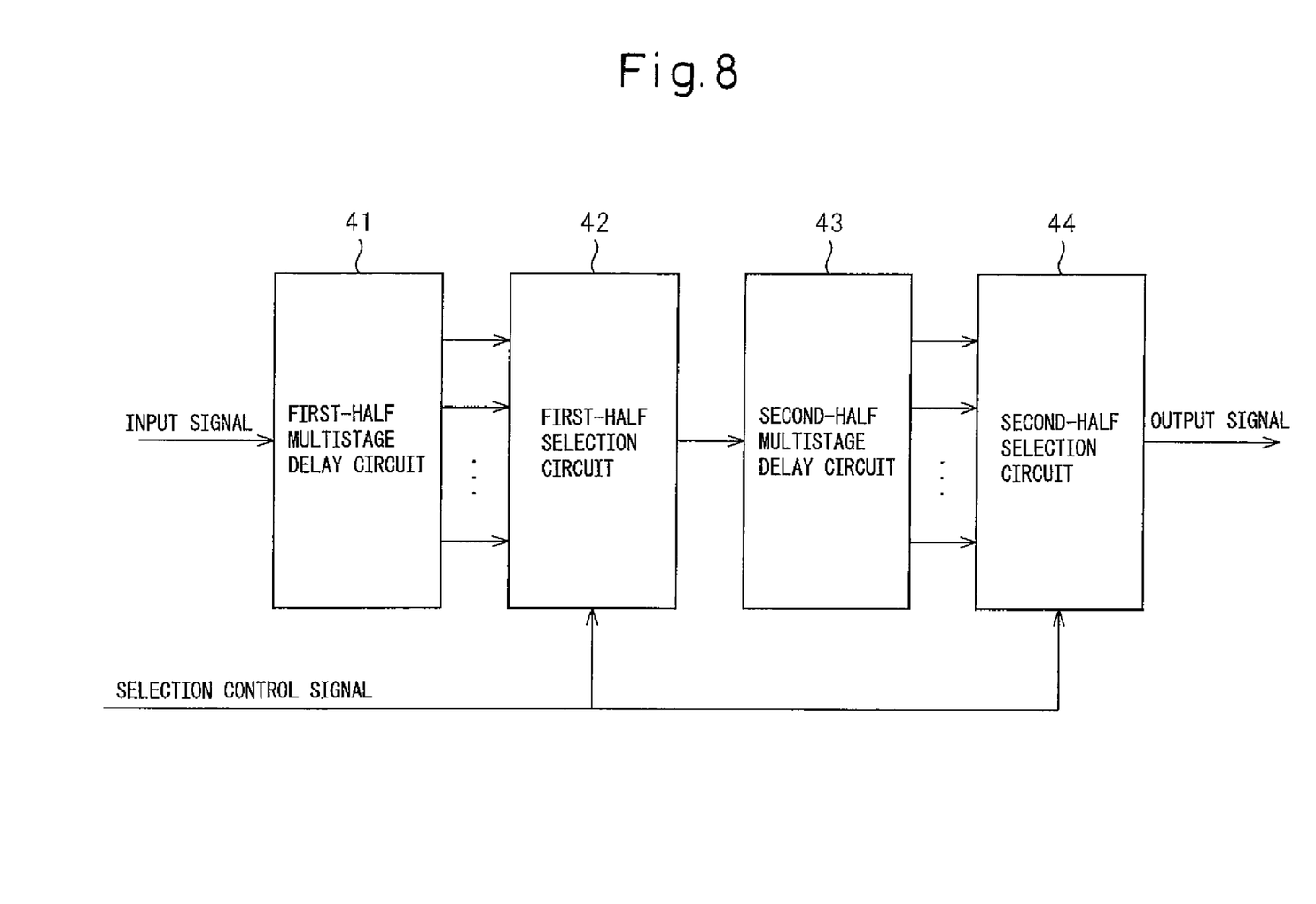
FIG. 8 is a diagram illustrating an example of the multistage delay circuit and selection circuit depicted in FIG. 4.
Figure 9:
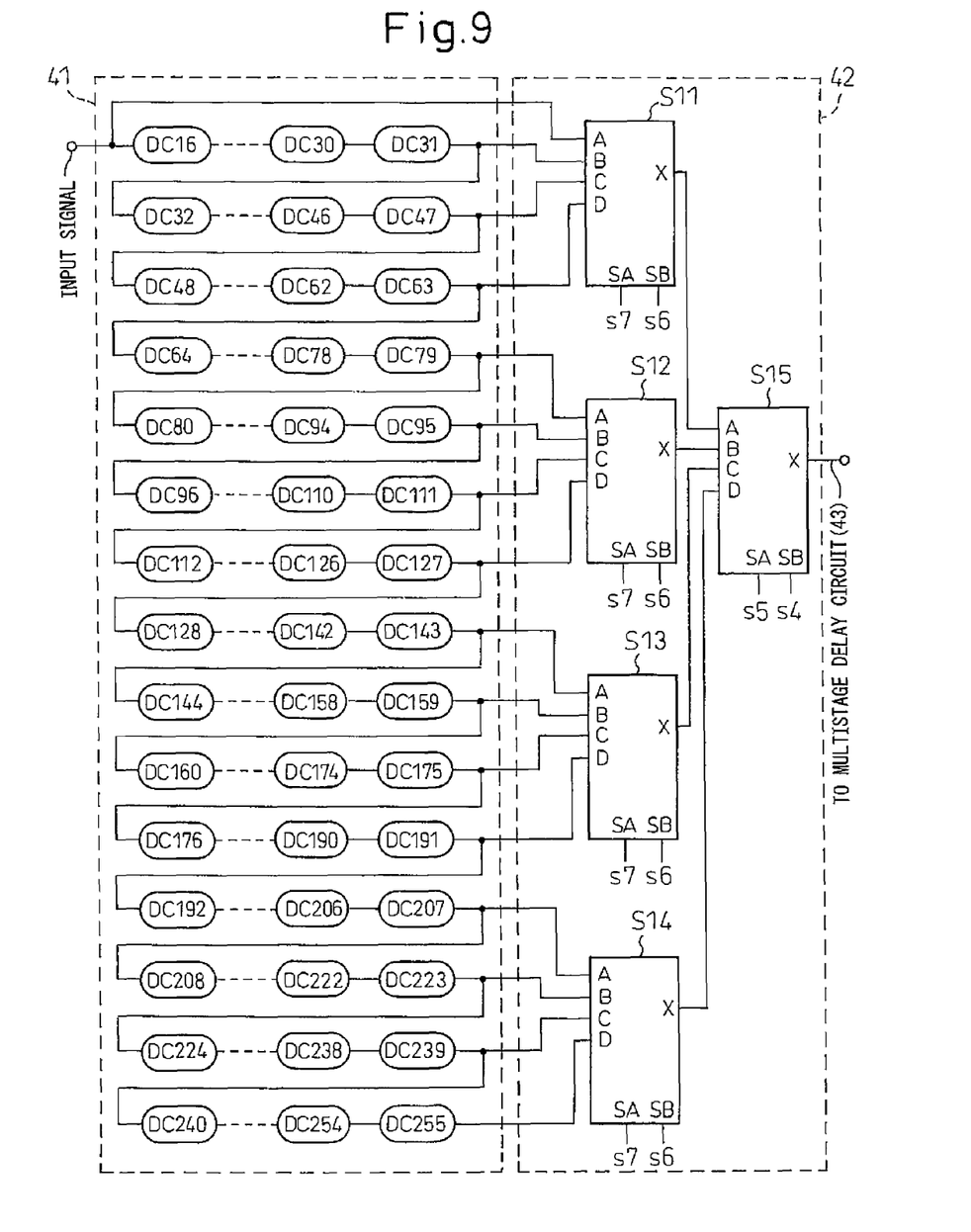
FIG. 9 is a diagram illustrating the configuration of a first-half multistage delay circuit and first-half selection circuit depicted in FIG. 8.
Figure 10:
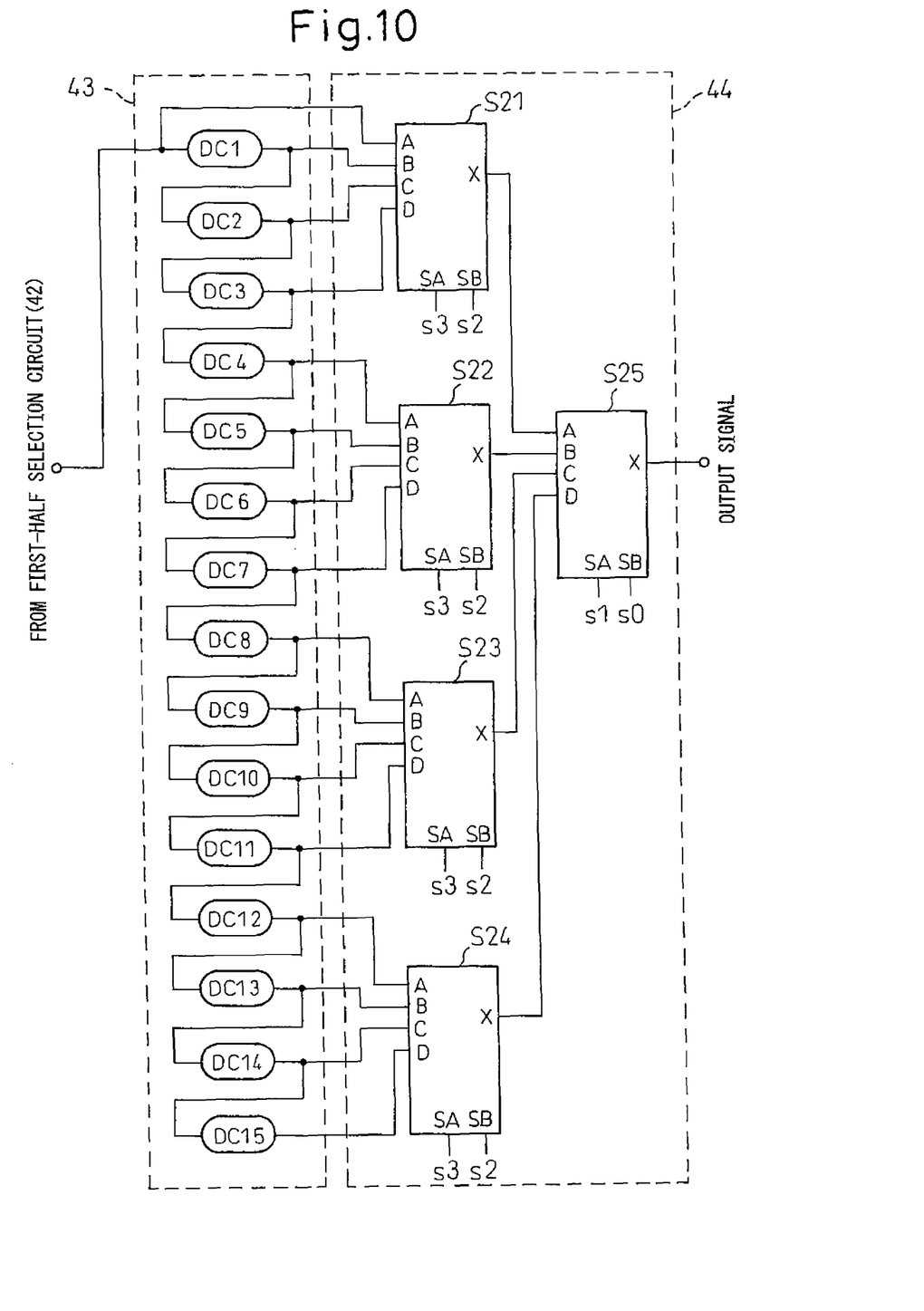
FIG. 10 is a diagram illustrating the configuration of a second-half multistage delay circuit and second-half selection circuit depicted in FIG. 8.

FIG. 8 is a diagram illustrating an example of the multistage delay circuit 20 and selection circuit 21 depicted in FIG. 4, FIG. 9 is a diagram illustrating the configuration of a first-half multistage delay circuit 41 and first-half selection circuit 42 depicted in FIG. 8, and FIG. 10 is a diagram illustrating the configuration of a second-half multistage delay circuit 43 and second-half selection circuit 44 depicted in FIG. 8.

As illustrated, the first-half multistage delay circuit 41 is constructed from 16×15 delay elements DC16 to DC255 connected in series.

The first-half selection circuit 42 is a selection circuit which, based on the value of the high-order four bits (S7 to S4) of the eight-bit selection control signal, selects either the input signal to the first-half multistage delay circuit 41 or one of the 15 signals respectively output from delay elements (DC31, DC47, DC63, DC79, DC95, ..., DC239, and DC255) for every 16 delay elements in the 16×15 delay elements DC16 to DC255. The selection circuit 42 includes selectors S11 to S15 each of which selects one of four input signals (A to D) by a two-bit address input (SA and SB) and outputs the selected signal from an X terminal.

The second-half multistage delay circuit 43 is constructed from 15 delay elements DC1 to DC15 connected in series.

The second-half selection circuit 44 is a selection circuit which, based on the value of the low-order four bits (S3 to S0) of the selection control signal, selects either the input signal to the second-half multistage delay circuit 43 or one of the signals output from the 15 delay elements DC1 to DC15. The second-half selection circuit 44 also includes selectors S21 to S25 similar to the selectors S11 to S15. The signal selected by the first-half selection circuit 42 is input into the second-half multistage delay circuit 43.

With the application of the selection control signal that increases in increments of 1 from "0" to "255" in sequence, the multistage delay circuit and selection circuit configured as illustrated in FIGS. 8 to 10 can provide propagation delays through 0 to 255 delay elements to the input signal applied to the first-half multistage delay circuit 41.

Figure 11:
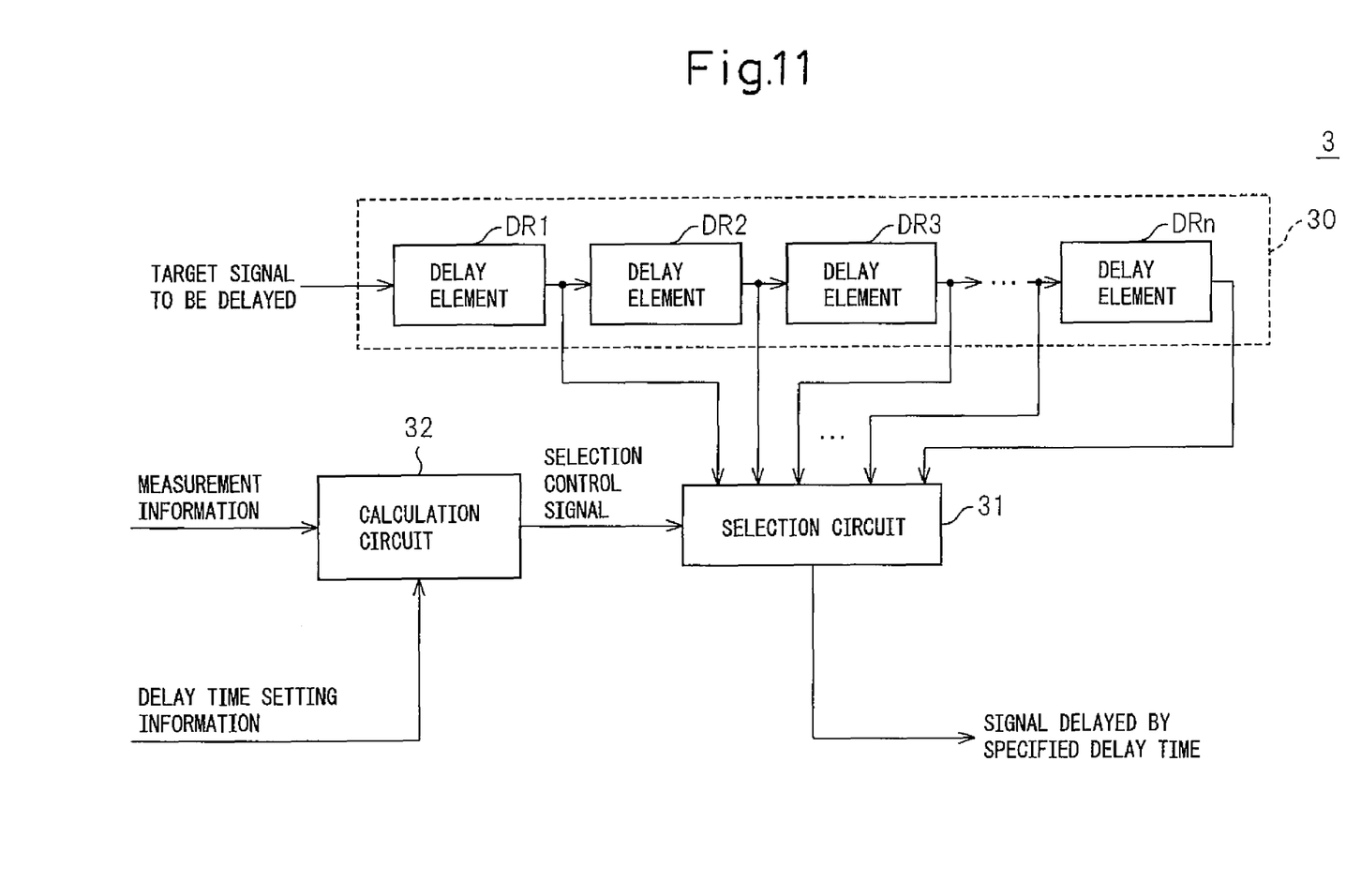
FIG. 11 is a schematic configuration diagram of a delay circuit depicted in FIG. 3.

FIG. 11 is a schematic configuration diagram of the delay circuit depicted in FIG. 3. The delay circuit 3 includes a multistage delay circuit 30 which delays the target signal through series-connected delay elements DR1 to DRn, a calculation circuit 32 which determines the number of delay elements through which to pass the target signal based on the measurement information supplied from the measuring circuit 2 and on a predetermined delay time set value, and a selection circuit 31 which extracts from the multistage delay circuit 30 the signal delayed through the number of delay elements determined by the calculation circuit 32.

Figure 12:
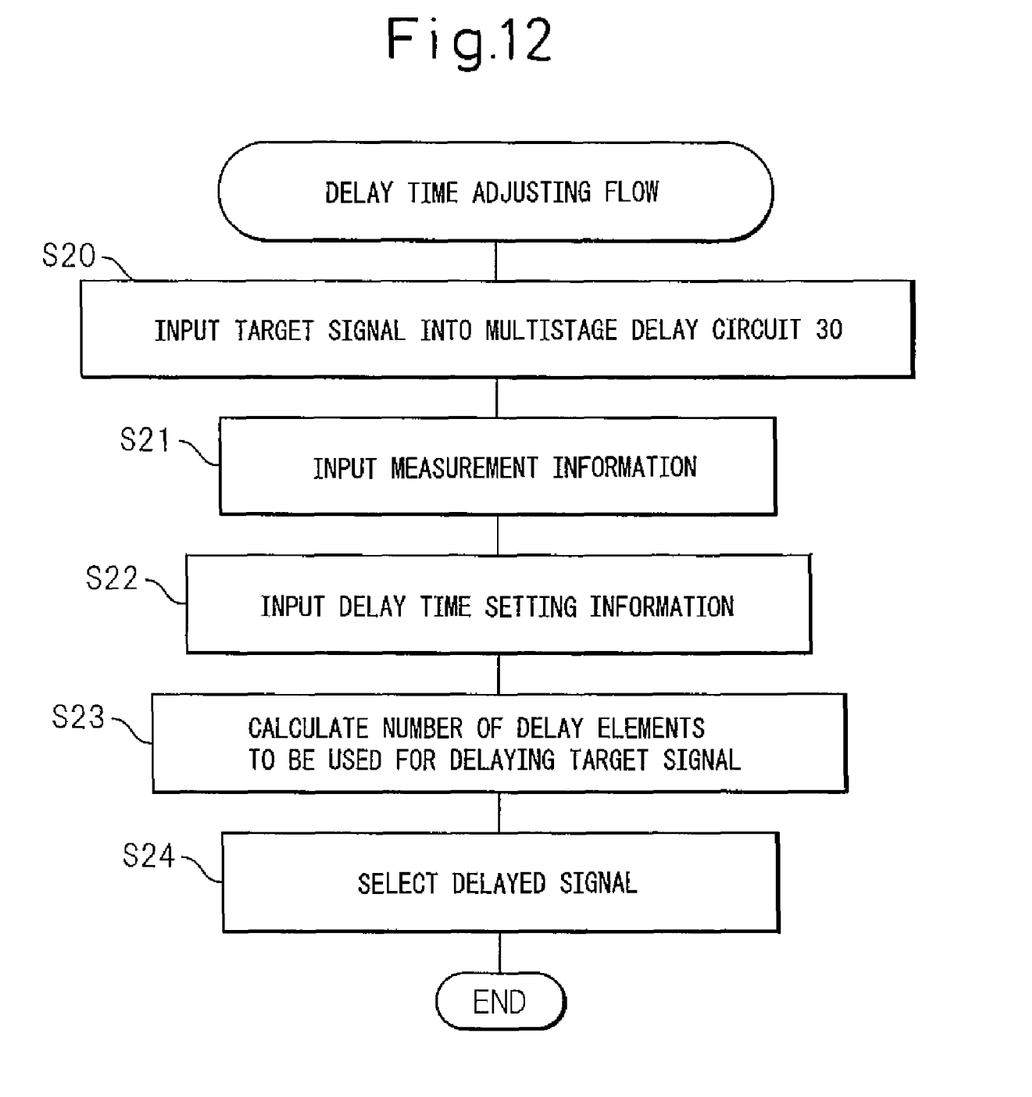
FIG. 12 is a flowchart of a delay time adjusting method according to the embodiment of the present invention.

FIG. 12 is a flowchart of a delay time adjusting method according to the embodiment of the present invention.

In step S20, the target signal to be delayed is input into the multistage delay circuit 30, and in step S21, the measurement information from the measuring circuit 2 is input into the calculation circuit 32. In step S22, prescribed delay time setting information for setting the delay time to be provided to the target signal is input into the calculation circuit 32.

In step S23, the calculation circuit 32 performs a calculation to determine how many delay elements in the array of the delay elements DR1 to DRn of the multistage delay circuit 30 should be used for delaying the target signal. That is, the calculation circuit 32 determines the ordinal number of the delay element from which the delayed signal is to be extracted.

The delay time setting information can be provided in various ways; for example, in one method, the delay time is specified by the coefficient (x/y) for one clock cycle (Tc) of the reference clock. The delay time Td is then given as Td=Tc×(x/y)

In this case, the number of elements, z, to be used for delaying the target signal is calculated as z=(k−m)×(x/y).

The following describes the reason that when the number of elements, z, to be used is determined in this way, the delay adjustment can be made without being influenced by variations in the external environment. For example, consider the case where the ambient temperature changes from −10° C. to +25° C. and then to +80° C., causing the delay time of each delay element to change, and thus causing the value of (k−m) to change from 100 to 200 and then to 300.

Suppose here that one half of the clock cycle is specified as the delay time by which to delay the target signal; in this case, when the ambient temperature is −10° C., +25° C., and +80° C., respectively, the number of delay elements calculated by the calculation circuit 32 is 50, 100, and 150, respectively. Thus, it can be seen that the amount of delay equal to one half of the clock cycle is provided to the target signal, irrespective of the changes in temperature.

In another method of providing the delay time setting information, the delay time is specified by the absolute time Ta. This method is based on the assumption that one clock cycle Tc of the reference clock is known. In this case, the number of elements, z, to be used for delaying the target signal is calculated as z=(k−m)×(Ta/Tc).

As in the above example, consider the case where the ambient temperature changes from −10° C. to +25° C. and then to +80° C., causing the delay time of each delay element to change, and thus causing the value of (k−m) to change from 100 to 200 and then to 300.

Suppose here that one clock cycle Tc of the reference clock is given as 100 μs and the absolute delay time Ta as 50 μs; in this case, when the ambient temperature is −10° C., +25° C., and +80° C., respectively, the number of delay elements calculated by the calculation circuit 32 is 50, 100, and 150, respectively. Thus, it can be seen that the amount of delay equal to 50 μs is provided to the target signal, irrespective of the changes in temperature.

In step S24, the calculation circuit 32 outputs the number of delay elements, z, calculated in step S23 as the selection control signal to the selection circuit 31. Thereupon, the selection circuit 31 selects as the delayed signal the output signal of the delay element whose element number is z.

As can be seen from a comparison between the measuring circuit 2 of FIG. 4 and the delay circuit 3 of FIG. 11, the multistage delay circuits 20 and 30 and the selection circuits 21 and 32, respectively, are identical in circuit configuration. Accordingly, unlike the case of the delayed signal generating circuit disclosed in the earlier cited patent document 1, there occurs no difference in delay time between the delay elements D1 to Dn in the multistage delay circuit 20 and the delay elements DR1 to DRn in the multistage delay circuit 30.

Therefore, when the number of delay elements, (k−m), corresponding to one clock cycle of the reference clock is measured by delaying the reference clock through the multistage delay circuit 20, and the number of delay elements, z, to be used for delaying the target signal is adjusted based on the measured value (k−m), if changes occur in the delay times of the multistage delay circuits 20 and 30 due to variations in external environment (such as temperature and voltage) or because of differences in manufacturing process, since they cancel each other out a highly precise delay adjustment can be accomplished without being affected by such variations in external environment or differences in manufacturing process. Accordingly, when applying the variable delay circuit 1 of the present invention to different kinds of semiconductor circuits produced by different manufacturing processes, all that is needed would, at most, be to change the number of stages of delay elements to be provided in the multistage delay circuit, and there is no need to change the basic configuration of the circuit.

The multistage delay circuit 30 and selection circuit 31 depicted in FIG. 11 can also be implemented using the configuration illustrated in FIGS. 8 to 10.

In the above embodiment, the decision circuit 23 has been described as making a decision on the logic state of the input signal at the rising edge of the reference clock, but alternatively, the decision may be made at the falling edge. In that case, the changing point detection unit 24 detects the point at which the signal logic changes from "Hi" to "Lo".

Further, the decision circuit 23 may use both the rising edge and falling edge as the signal logic decision timing, and the changing point detection unit 24 may output the element numbers of the delay elements where the respective signal logic changes have occurred. In this case, the delay circuit 3 can adjust the number of delay elements, z, to be used for delaying the target signal, based on the number of delay elements that provide a delay time corresponding to a pulse duration shorter than one clock cycle of the reference clock. In this case, however, information concerning the duty ratio of the reference clock becomes necessary.

According to the present invention, there is provided a delay circuit that is not affected by variations in the external environment (such as temperature and voltage) and that does not require changing the basic configuration of the circuit even when the semiconductor manufacturing process used for implementing the mounting of the circuit is changed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

INDUSTRIAL APPLICABILITY

The present invention is applicable to a delay circuit mounted in a semiconductor integrated circuit and a delay time adjusting method for adjusting the delay time of such a delay circuit.

What is claimed is:

1. A delay adjusting method comprising;
inputting a reference clock into a first multistage delay circuit constructed by connecting a plurality of delay elements in series;
at decision timing synchronized to said reference clock, making a decision on a logic state of each delayed signal sequentially selected from among a plurality of delayed signals obtained by introducing different amounts of delay by passing said reference clock through one or more of said delay elements;
detecting from among said delay elements at least two delay elements where a change has occurred in the logic state of said reference clock at said decision timing;
determining the number of delay elements that provides a desired delay time, by taking a difference between the numbers of delay elements through which said clock signal has passes until reaching respective ones of said two detected delay elements;
inputting an input signal into a second multistage delay circuit constructed from a plurality of delay elements connected in series;
multiplying a set value with said determined number of delay elements so as to determine the number of delay elements to be used to pass said input signal therethrough in said second multistage delay circuit; and
extracting from said second multistage delay circuit said input signal that has been delayed through said number of delay elements determined to be used.

2. A delay adjusting method as claimed in claim 1, wherein said desired delay time corresponds to one clock cycle of said reference clock.

3. A delay adjusting method as claimed in claim 1, wherein said first multistage delay circuit comprises a second-half multistage delay circuit constructed by connecting N delay elements in series (N is a natural number) and a first-half multistage delay circuit constructed by connecting (N+1)×N delay elements in series, and wherein
when selecting said plurality of delayed signals from said first multistage delay circuit, one of the delayed signals respectively output from every N delay elements in said first-half multistage delay circuit is selected and input into said second-half multistage delay circuit, and one of the delayed signals respectively output from said delay elements constituting said second-half multistage delay circuit is selected.

4. A delay adjusting method as claimed in claim 1, wherein said second multistage delay circuit comprises a second-half multistage delay circuit constructed by connecting N delay elements in series and a first-half multistage delay circuit constructed by connecting (N+1)×N delay elements in series, and wherein when selecting said plurality of delayed signals from said second multistage delay circuit, one of the delayed signals respectively output from every N delay elements in said first-half multistage delay circuit in said second multistage delay circuit is selected and input into said second-half multistage delay circuit in said second multistage delay circuit, and one of the delayed signals respectively output from said delay elements constituting said second-half multistage delay circuit in said second multistage delay circuit is selected.

5. A delay circuit, comprising:

a first multistage delay circuit constructed by connecting a plurality of delay elements in series;

a first selecting unit which selects any of a plurality of delayed signals obtained by introducing different amounts of delay by passing a reference clock through one or more of said delay elements;

a decision unit which, at decision timing synchronized to said reference clock, makes a decision on a logic state of each delayed signal sequentially selected by said first selecting unit from among said plurality of delayed signals;

a changing point detection unit which detects from among said delay elements at least two delay elements where a change has occurred in the logic state of said reference clock at said decision timing a calculation circuit which determines the number of delay elements through which an input signal is to be passed, by multiplying a set value with a difference between the numbers of delay elements which said clock signal has passes until reaching respective ones of said two detected delay elements;

a second multistage delay circuit constructed by connecting a plurality of delay elements in series; and a second selecting unit which extracts, from said second multistage delay circuit into which said input signal is input, said input signal that has been delayed through the number of delay elements determined by said calculation circuit.

6. A variable delay circuit as claimed in claim 5, wherein said desired delay time corresponds to one clock cycle of said reference clock.

7. A delay circuit as claimed in claim 5, wherein said first multistage delay circuit comprises a second-half multistage delay circuit constructed by connecting N delay elements in series (N is a natural number) and a first-half multistage delay circuit constructed by connecting $(N+1) \times N$ delay elements in series, and said first selecting unit comprises a second-half selecting unit which selects one of the delayed signals respectively output from said delay elements constituting said second-half multistage delay circuit, and a first-half selecting unit which selects one of the delayed signals respectively output from every N delay elements in said first-half multistage delay circuit, and wherein the signal selected by said first-half selecting unit is input into said second-half multistage delay circuit.

8. A variable delay circuit as claimed in claim 5, wherein said second multistage delay circuit comprises a second-half multistage delay circuit constructed by connecting N delay elements in series (N is a natural number) and a first-half multistage delay circuit constructed by connecting $(N+1) \times N$ delay elements in series, and said second selecting unit comprises a second-half selecting unit which selects one of the delayed signals respectively output from said delay elements constituting said second-half multistage delay circuit in said second multistage delay circuit, and a first-half selecting unit which selects one of the delayed signals respectively output from every N delay elements in said first-half multistage delay circuit in said second multistage delay circuit, and wherein the signal selected by said first-half selecting unit in said second selecting unit is input into said second-half multistage delay circuit in said second multistage delay circuit.

* * * * *